United States Patent [19]

Swanstrom

[11] Patent Number: 4,577,402
[45] Date of Patent: Mar. 25, 1986

[54] STUD FOR MOUNTING AND METHOD OF MOUNTING HEAT SINKS ON PRINTED CIRCUIT BOARDS

[75] Inventor: Kenneth A. Swanstrom, Buckingham Township, Bucks County, Pa.

[73] Assignee: Penn Engineering & Manufacturing Corp., Danboro, Pa.

[21] Appl. No.: 620,141

[22] Filed: Jun. 13, 1984

[51] Int. Cl.[4] .......... H05K 3/39; F16B 39/00; F16B 37/04; F16B 39/282
[52] U.S. Cl. .......... 29/840; 411/176; 411/180; 411/187; 411/424; 174/16 HS; 361/386
[58] Field of Search .......... 29/840; 357/81; 174/16 HS; 411/103, 107, 176, 177, 180, 181, 184, 378, 411, 424, 187, 188; 361/386

[56] References Cited

U.S. PATENT DOCUMENTS

| | | | |
|---|---|---|---|
| 121,060 | 11/1871 | Mutimer | 411/424 |
| 1,396,455 | 11/1921 | Moore | 411/411 |
| 2,001,290 | 5/1935 | Thomson | 29/526 X |
| 2,024,070 | 12/1935 | Sharp | 411/424 X |
| 3,200,296 | 8/1965 | Bruestle | 174/16 HS X |
| 3,346,286 | 10/1967 | Wescott | 411/176 X |
| 3,699,637 | 10/1972 | Rosiek | 411/176 X |
| 3,908,188 | 9/1975 | Kawamoto | 174/16 HS X |
| 4,321,423 | 3/1982 | Johnson et al. | 174/16 HS |
| 4,357,746 | 11/1982 | Kytta | 411/176 X |
| 4,403,102 | 9/1983 | Jordan et al. | 29/840 X |

OTHER PUBLICATIONS

PEM ® Fasteners for Use in or with PC Boards, Bulletin K480 by Penn Eng'r. and Mfg. Co., Copyright 1962, 1970, 1971, 1974, 1976 and 1980.

*Primary Examiner*—Howard N. Goldberg
*Assistant Examiner*—Carl J. Arbes
*Attorney, Agent, or Firm*—Gregory J. Gore

[57] ABSTRACT

A stud with a threaded shank at one end and a flat head at the other end. Between the threaded shank and the flat head is a collar of smaller diameter than the head, but of larger diameter than the threaded shank. The collar has a knurled portion adjacent the head to secure the stud to a printed circuit board. At the juncture of the collar with the threaded shank, the collar forms a shoulder or seat upon which the heat sink and the semiconductor case rest in spaced relation with the printed circuit board. A nut is then threaded onto the shank to secure the stud, the heat sink, the semi-conductor case and the printed circuit board to each other.

8 Claims, 5 Drawing Figures

4,577,402

STUD FOR MOUNTING AND METHOD OF MOUNTING HEAT SINKS ON PRINTED CIRCUIT BOARDS

BACKGROUND OF THE INVENTION

This invention relates to studs for mounting heat sinks and semi-conductor cases on printed circuit boards so that a space is provided between the heat sinks and the circuit boards to aid in the dissipation of heat from the heat sinks, to provide clearance over other components which may be mounted on the circuit board, and to facilitate washing of the circuit board after soldering.

Previously known patents which provide fasteners for this purpose are Johnson et al U.S. Pat. No. 4,321,423, Jordon et al U.S. Pat. No. 4,403,102 and Jordon et al U.S. Pat. No. 4,446,504.

BRIEF SUMMARY OF THE INVENTION

In one embodiment of my invention I provide a stud with a threaded shank at one end and a flat head at the other end. Between the threaded shank and the flat head is a collar of smaller diameter than the head but of larger diameter than the threaded shank. The collar has a knurled portion adjacent the head to secure the stud to a printed circuit board. At the juncture of the collar with the threaded shank, the collar forms a shoulder or seat upon which the heat sink and the semi-conductor case rest in spaced relation with the printed circuit board. A nut is then threaded onto the shank to secure the stud, the heat sink, the semi-conductor case and the printed circuit board to each other.

The stud may be pressed into the printed circuit board with suitable pressure and is sufficiently secured to the printed circuit board so as to not fall out during assembly. Further, the shoulder of the stud provides a positive location for the heat sink and the semi-conductor case during insertion of the stud into the printed circuit board.

The entire stud is suitably plated for ease of manufacturing and after assembly to the printed circuit board, the plated head is wave soldered to the printed circuit board by well known methods.

Thus, it is an object of this invention to provide a modified stud for economically and expediently securing together a heat sink, a semi-conductor case and a printed circuit board.

The foregoing and other objects of the invention, the principles of the invention and the best modes in which I have contemplated applying such principles will more fully appear from the following description and accompanying drawings in illustration thereof.

BRIEF DESCRIPTION OF THE VIEWS

DESCRIPTION OF THE PREFERRED EMBODIMENTS

Figure 1:
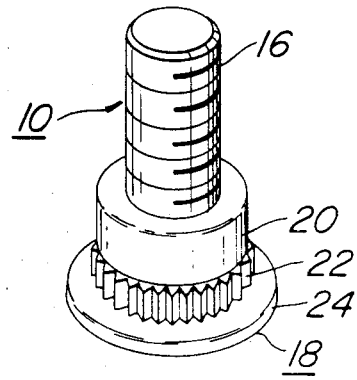
FIG. 1 is a top and side perspective view of the stud of this invention.
Figure 2:
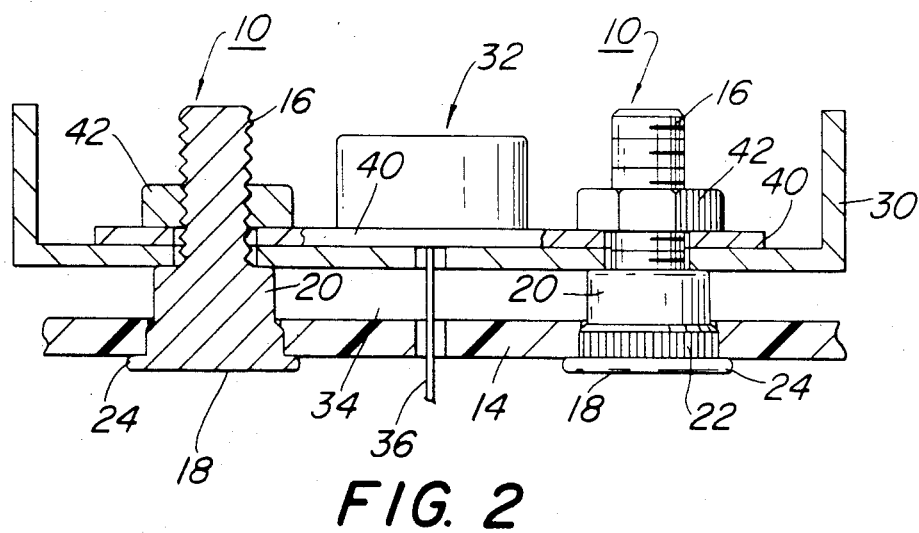
FIG. 2 is mostly a cross-sectional view showing one stud in cross-section and one stud in side elevation, the printed circuit board in cross-section and the transistor assembly mostly in cross-section and partially in side elevation, the studs being the same as that shown in FIG. 1.

Referring to the drawings, a stud 10 is illustrated in FIG. 1 especially adapted for securing together a heat sink 30 and a semi-conductor case 32 in spaced relation to a printed circuit board 14, as shown in FIG. 2.

The stud 10 includes a threaded shank 16 at one end and a flat head 18 at the other end. Between the threaded shank 16 and the flat head 18 is a collar 20, the collar 20 being of smaller diameter than the head 18, but of larger diameter than the threaded shank 16. The collar 20 includes a knurled annular portion 22 immediately adjacent to the head 18 which extends along the length of the collar 20 a short distance, as shown, preferably a distance less than the thickness of the printed circuit board 14. The head 18 overhangs the knurled portion 22 and its outermost portion forms an annular flange 24 which abuts the underside of the printed circuit board 14 when the stud 10 is attached thereto, as shown in FIG. 2.

The collar 20 has an outer diameter which is greater than that of the threaded shank 16 so that at the juncture of the collar 20 and the shank 16 an annular shoulder or seat 26 is formed upon which rests the heat sink 30 and the semi-conductor case 32.

Since the knurled portion 22 extends out from the outer surface of the collar 20 for a short distance along the length of the collar, the portion of the collar above the knurled portion acts as a pilot when the stud 10 is inserted into the printed circuit board 14.

Thus, by resting the heat sink 30 and the semi-conductor case 32 on the shoulder 26 a space 34 is provided between the heat sink 30 and the printed circuit board 14 which helps in the dissipation of heat, provides clearance over other components (not shown) which may be mounted on the printed circuit board 14, and which facilitates washing of the circuit board after soldering.

The printed circuit board 14 is, of course, provided with suitable holes, as shown, having a diameter slightly less than the outside diameter of the knurled portion 22.

The heat sink 30 and the printed circuit board 14 are provided with suitable aligned holes through which extend leads 36 from the semi-conductor case 32. Also, the semi-conductor case 32 includes a flange 40 which has suitable holes aligned with similar holes in the heat sink 30 through which the threaded shank 16 of the stud 10 extends, as shown in FIG. 2.

To assemble the heat sink 30 and the semi-conductor case 32 to the printed circuit board 14, the stud 10 is first inserted into the hole provided for this purpose in the printed circuit board. This can be done with suitable pressure applied to the head 18 at which time the knurled portion 22 broaches into the printed circuit board. The stud 10 is inserted from the underside of the printed circuit board so that the flange 24 of the head 18 will abut the surface of the printed circuit board to be subsequently wave soldered. The heat sink 30 is then placed on the shoulders 26 (of the two studs 10 shown in FIG. 2.) and the semi-conductor case 32 is placed on top of the heat sink 30 with the threaded shanks 16 extending through the aligned holes in the heat sink 30 and the flange 40.

Suitable nuts 42 are then threaded onto the shanks 16 to firmly secure the assembly together, unlike some prior art devices in which there is no positive mechanical fastening as is provided in this invention by the mechanical fastening of the knurled portion 22 to the printed circuit board 14 and the threaded shank 16-nut 42 connection.

Figure 3:
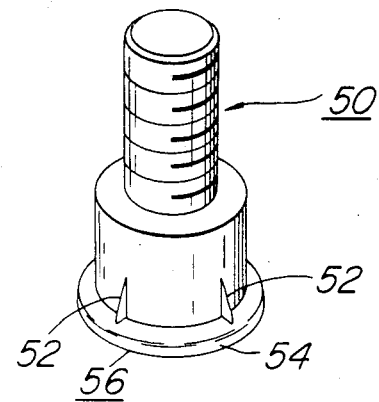
FIG. 3 is a top and side perspective view of a modified stud.

FIG. 3 shows a stud 50 similar to the stud 10 of FIGS. 1 and 2. However, the stud 50 is provided with an annular array of ribs 52 spaced from each other as shown instead of the knurled portion 22 shown in FIGS. 1 and 2. The ribs 52 are relatively thin and tapered, as shown, to be wider at their bases adjacent the flange 54 of the head 56 than at their tops. The height of the ribs 52 is approximately equal to or less than the thickness of the printed circuit board. The ribs 52 are pressed into the printed circuit board (not shown) with suitable pressure. In all other respects, the stud of FIG. 3 is the same as the stud of FIGS. 1 and 2.

Figure 4:
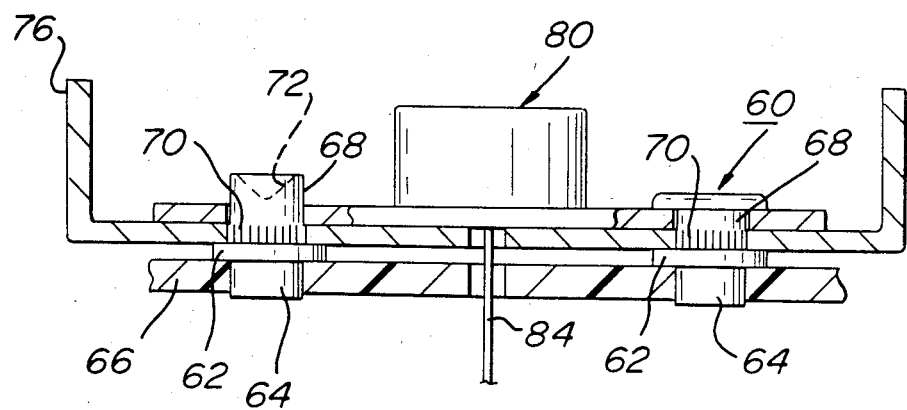
FIG. 4 is a view similar to FIG. 2 but showing a further modified stud.
Figure 5:
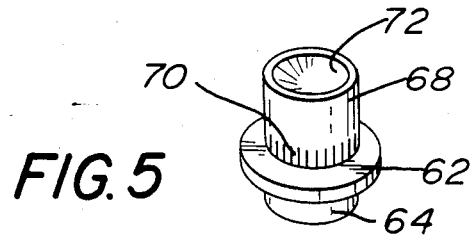
FIG. 5 is a top and side perspective view of the stud shown in FIG. 4.

FIGS. 4 and 5 illustrate a further embodiment of my invention. FIGS. 4 and 5 show a stud 60 which includes a collar or flange 62. Below the collar 62 is a head 64 of smaller diameter than the collar 62 and extending therebelow, as shown, into a suitable hole in a printed circuit board 66 with a slidable fit.

Extending upwardly from the collar 62 is a shank 68. The portion of the shank 68 immediately adjacent the collar 62 is provided with a knurled portion 70 which extends out beyond the outside diameter of the shank 68 but is well within the diameter of the collar 62. The upper end of the shank 68 is provided with a well or recess 72 to facilitate bending or peening over of the shank 68.

To assemble the heat sink 76 and the semi-conductor case 80 to the stud 60, the knurled portion 70 of the shank 68 is pressed into a suitable hole in the heat sink 76. The flange 78 of the semi-conductor case 80 is placed over the shank 68 so that the latter extends through a suitable hole provided in the flange 78. The upper end portion of the shank 68 is then bent or peened over to trap the flange 78 between the heat sink 76 and the bent over part of the shank 68. In FIG. 4, the left hand stud 60 has not been bent over, whereas the right hand stud 60 has been deformed against the flange 78. It will be understood that prior to wave soldering both studs would be peened over.

The semi-conductor case 80 of FIG. 4 may also be provided with suitable leads 84 (only one of which is shown) which extend through suitable holes in the heat sink 76 and the printed circuit board 66.

Thus, the stud 60 provides a fastener for securing the heat sink 76 and the flange 78 to each other as a sub-assembly. This sub-assembly is then added to the printed circuit board by inserting the heads 64 through the holes provided in the printed circuit board 66. The heads 64 extend slightly below the undersurface of the printed circuit board, as shown, and the leads 84 extend through the holes provided in the heat sink 76 and printed circuit board 66. The entire assembly is then wave soldered, as is well known.

From the foregoing, it is seen that the stud 60 is first secured to the heat sink 76 by virtue of the knurled portion 70 and these two parts may be handled as one sub-assembly. Thereafter, the semi-conductor case 80 is secured upon the heat sink 76 by peening over the upper ends of the shanks 68.

What I claim is:

1. The method of securing a heat sink and a semi-conductor case to a circuit board comprising
    inserting with suitable pressure a stud into a circuit board from the underside of said circuit board, said stud having knurled portion broaching into said circuit board and a head having a flange overhanging said knurled portion to limit by abutment of the flange and the underside of the circuit board the movement of the stud relative to the circuit board,
    placing said heat sink and said semi-conductor upon a shoulder formed between a threaded shank and a collar of said stud, said collar being disposed between said threaded shank and a head, said threaded shank extending through suitable openings in said heat sink and said semi-conductor case, and
    attaching a threaded nut to said threaded shank so as to secure said heat sink and said semi-conductor case against said shoulder.

2. The method of claim 1 and further including soldering said head to said circuit board.

3. A stud for assembling a heat sink and a semi-conductor cast to a circuit board wherein
    said stud comprises a threaded shank at one end for receiving a threaded nut and a flat head at the other end,
    a cylindrical collar between the threaded shank and the flat head,
    said collar being of smaller diameter than said head but larger diameter than said threaded shank,
    said collar having a knurled portion adjacent said head for securing said stud to said circuit board,
    the large diameter of said collar relative to said threaded shank defining a shoulder, an annular ring perpendicular to the axis of said shank, upon which are seated said heat sink and semi-conductor case, and
    at least said head being suitably plated to facilitate its soldering to said circuit board.

4. The stud of claim 3 wherein
    said knurled portion extends along said collar for a distance equal to or less than the thickness of the circuit board said distance being substantially less than the length of said collar.

5. The stud of claim 3 or 4 wherein
    said head includes a flange overhanging said knurled portion and which provides a stop for limiting insertion of said stud through said curcuit board.

6. The stud of claim 4 further including a portion around the circumference of said collar above the knurled portion to act as a pilot when the stud is inserted into the circuit board.

7. A stud for assembling a heat sink and semi-conductor case or the like to a circuit board wherein
    said stud comprises a threaded shank at one end for receiving a threaded nut and a flat head at the other end,
    a collar between the threaded shank and the flat head,
    said collar being of smaller diameter than said head but of larger diameter than said threaded shank,
    an annular array of relatively thin tapered ribs wider at their bases which meet the flange of said head than at their tops which meet said collar at points along its circumference,
    the larger diameter of said collar relative to said threaded shank defining a shoulder perpendicular to the axis of said shank upon which is seated said heat sink and semi-conductor, case, and
    at least said head being suitably plated to facilitate its soldering to said circuit board.

8. The stud of claim 7 further including a portion around the circumference of said collar above said ribs to act as a pilot when the stud is inserted into the circuit board.

* * * * *